(12) United States Patent
Shringarpure et al.

(10) Patent No.: US 9,882,539 B1
(45) Date of Patent: Jan. 30, 2018

(54) MULTI-DATA RATE, BURST-MODE TRANSIMPEDANCE AMPLIFIER (TIA) CIRCUIT

(71) Applicant: Avago Technologies General IP (Singapore) Pte. Ltd., Singapore (SG)

(72) Inventors: Rahul Shringarpure, Hayward, CA (US); Georgios Asmanis, Lake Forrest, CA (US); Faouzi Chaahoub, San Jose, CA (US); Kartikeya Gupta, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/224,663

(22) Filed: Jul. 31, 2016

(51) Int. Cl.
| | | |
|---|---|---|
| *H03G 3/30* | (2006.01) | |
| *H03F 3/45* | (2006.01) | |
| *H04B 1/16* | (2006.01) | |
| *H04B 10/61* | (2013.01) | |

(52) U.S. Cl.
CPC ....... *H03G 3/3084* (2013.01); *H03F 3/45278* (2013.01); *H04B 1/16* (2013.01); *H04B 10/616* (2013.01); *H03F 2200/78* (2013.01); *H03F 2203/45212* (2013.01); *H03F 2203/45288* (2013.01)

(58) Field of Classification Search
CPC ............ H03G 3/3084; H03F 3/45278; H03F 2200/78; H03F 2203/45212; H03F 2203/45288; H04B 1/16; H04B 10/616
See application file for complete search history.

(56) References Cited

U.S. PATENT DOCUMENTS

| | | | |
|---|---|---|---|
| 6,218,905 B1 | 4/2001 | Sanders et al. | |
| 6,784,750 B2 | 8/2004 | Chiou et al. | |
| 9,030,263 B2 | 5/2015 | Robinson et al. | |
| 2010/0067913 A1* | 3/2010 | Niibe | H04B 10/70 398/98 |
| 2016/0142028 A1* | 5/2016 | Kim | G01R 19/04 330/253 |
| 2016/0261246 A1* | 9/2016 | Koizumi | H03G 3/3052 |

FOREIGN PATENT DOCUMENTS

| | | |
|---|---|---|
| CN | 105490647 A | 4/2016 |
| JP | 2007036328 A | 2/2007 |

OTHER PUBLICATIONS

English language machine translation of CN105490647, dated Apr. 13, 2016.
English language machine translation of JP2007036328, dated Feb. 8, 2007.

* cited by examiner

*Primary Examiner* — Shi K Li
*Assistant Examiner* — Mina Shalaby (57) ABSTRACT

A burst-mode TIA circuit for use in PON receivers is provided that supports multiple data rates, has high receiver sensitivity, wide dynamic range, and that performs burst-mode synchronization very quickly. The multi-rate burst-mode TIA circuit has a high-speed data path that has low input-referred noise. Based on the chosen data rate at which the multi-rate burst-mode TIA circuit will operate, the rate select switch selects an appropriate feedback resistor of the resistive feedback network.

19 Claims, 5 Drawing Sheets

MULTI-DATA RATE, BURST-MODE TRANSIMPEDANCE AMPLIFIER (TIA) CIRCUIT

TECHNICAL FIELD OF THE INVENTION

The invention relates to transimpedance amplifier (TIA) circuits. More particularly, the invention relates to a multi-data rate, burst-mode TIA circuit for fiber to the home (FTTH) applications

BACKGROUND OF THE INVENTION

A typical optical receiver (Rx) includes at least one photodiode that detects an optical signal and converts it into an electrical current signal and at least one transimpedance amplifier (TIA) that converts the electrical current signal into an electrical voltage signal. The photodetector, which is typically a P-intrinsic-N (PIN) photodiode, produces an electrical current signal in response to light detected by the photodetector. The TIA converts this electrical current signal into an output voltage signal having some gain, commonly referred to as transimpedance gain. The TIA circuit typically includes several control loops for improving performance, such as a direct current (DC) offset correction loop, an automatic gain control (AGC) loop, and a TIA feedback impedance adjustment loop.

FTTH Passive Optical Networks (PON) using Packet-based systems require burst-mode receivers that amplify input data instantaneously for each asynchronous packet. Currently, burst-mode PON receivers have the two standards: Institute of Electrical and Electronics Engineers (IEEE) Ethernet Passive Optical Netwoork (IEEE EPON) and International Telecommunication Union (ITU-T) Giga-bit-capable Passive Optical Networks (GPON). The IEEE EPON standard uses data rates of 1.25 Gigabits per second (Gb/s) and 10.05 Gb/s, whereas GPON uses 2.5 Gb/s and 9.95 Gb/s.

There are multiple challenges in designing burst-mode PON Receivers. One of the challenges involves receiver (Rx) Sensitivity. PON networks suffer from higher losses and hence require higher optical power budgets. As a result, the Rx sensitivity requirement is less than −28 decibel-milliwatts (dbm) at a data rate of 1.25 Gbps. To achieve such low Rx sensitivity values, the TIA needs to either have very low input-referred noise or very high gain, both of which are difficult requirements to meet.

Another challenge in designing burst-mode PON receivers is that they need to have a wide dynamic range (typically greater than around 22 db for 10 G EPON) due to the higher optical power budget requirement. Hence, the TIA gain has to be decreased under overload conditions when the input power is high and increased when the input power is very low (at sensitivity).

Another challenge in designing burst-mode PON receivers is enabling the receiver to perform burst-mode synchronization very quickly. Burst-mode PON receivers are packet based, which means they receive fixed-length asynchronous data bits. Each packet is broken down into preamble bits and payload bits. Rx synchronization must be performed during the preamble bit period, which is very short, e.g., less than 100 nanoseconds (ns) in case of GPON. Hence, a very fast synchronization scheme is needed that is capable of settling the TIA output to the correct amplitude before the output is sampled and retimed by the Clock and Data Recovery (CDR) circuit that follows the TIA.

Yet another challenge in designing today's burst-mode PON receivers is that they have to be capable of supporting multiple data rate operations. For example, the EPON burst-mode receiver can be required to provide an upstream burst data rate of 10.0 Gbps and a downstream burst data rate of 1.25 Gbps.

Accordingly, a need exists for a burst-mode TIA circuit that meets all of these design challenges.

DETAILED DESCRIPTION

In accordance with illustrative embodiments, a burst-mode TIA circuit for use in PON receivers is provided that supports multiple data rates, has high receiver sensitivity, wide dynamic range, and that performs burst-mode synchronization very quickly. A few illustrative embodiments of the burst-mode TIA circuit will now be described with reference to the FIGS. 1-5, in which like reference numerals represent like elements, features or components.

In accordance with an illustrative, or exemplary, embodiment, the multi-rate burst-mode TIA circuit has a high-speed data path that is made up of only first and second gain stages, which leads to the TIA circuit having very low input-referred noise. The first gain stage is a single-ended resistive feedback network that includes a rate select switch. Based on the chosen data rate at which the multi-rate burst-mode TIA circuit will operate, the rate select switch selects an appropriate feedback resistor of the resistive feedback network. The second gain stage is a single-to-differential fixed gain stage that converts the single-ended output signal of the first gain stage into a differential signal having an appropriate common-mode voltage for providing a seamless interface with the output transmission line.

The multi-rate burst-mode TIA circuit has two feedback loops. The first feedback loop is an AGC loop that regulates the first gain stage based on the amplitude level of the input signal to the first gain stage. In accordance with the illustrative embodiment, the AGC loop comprises a plurality of Schmitt Trigger-type Hysteresis comparators that function as respective level detectors for detecting respective different amplitude levels of the input signal to the first gain stage. The appropriate level detector is triggered when the amplitude level of the input signal reaches a certain voltage level. The outputs of the level detectors are provided to a current-mode digital-to-analog converter (DAC), which sets a gate voltage of a metal oxide semiconductor field effect transistor (MOSFET)-based variable feedback resistor in the first gain stage, thereby regulating the transimpedance gain of the first gain stage. The second feedback loop is a DC offset correction loop. In accordance with an illustrative embodiment, this loop comprises a current-boosting charge pump circuit that either sources or sinks an appropriate current into an integrating capacitor in the DC offset correcting feedback loop to correct the DC bias of the input signal received at the input of the first gain stage. The two feedback loops operate independently of one another with the AGC loop having a shorter settling time than the settling time of the DC-offset correction loop to allow very fast burst mode synchronization to be achieved.

As used in the specification and appended claims, the terms "a," "an," and "the" include both singular and plural referents, unless the context clearly dictates otherwise. Thus, for example, "a device" includes one device and plural devices.

It should be noted that when an element is referred to herein as being "connected to" or "coupled to" or "electrically coupled to" another element, it can be directly connected or coupled, or intervening elements may be present.

Figure 1:
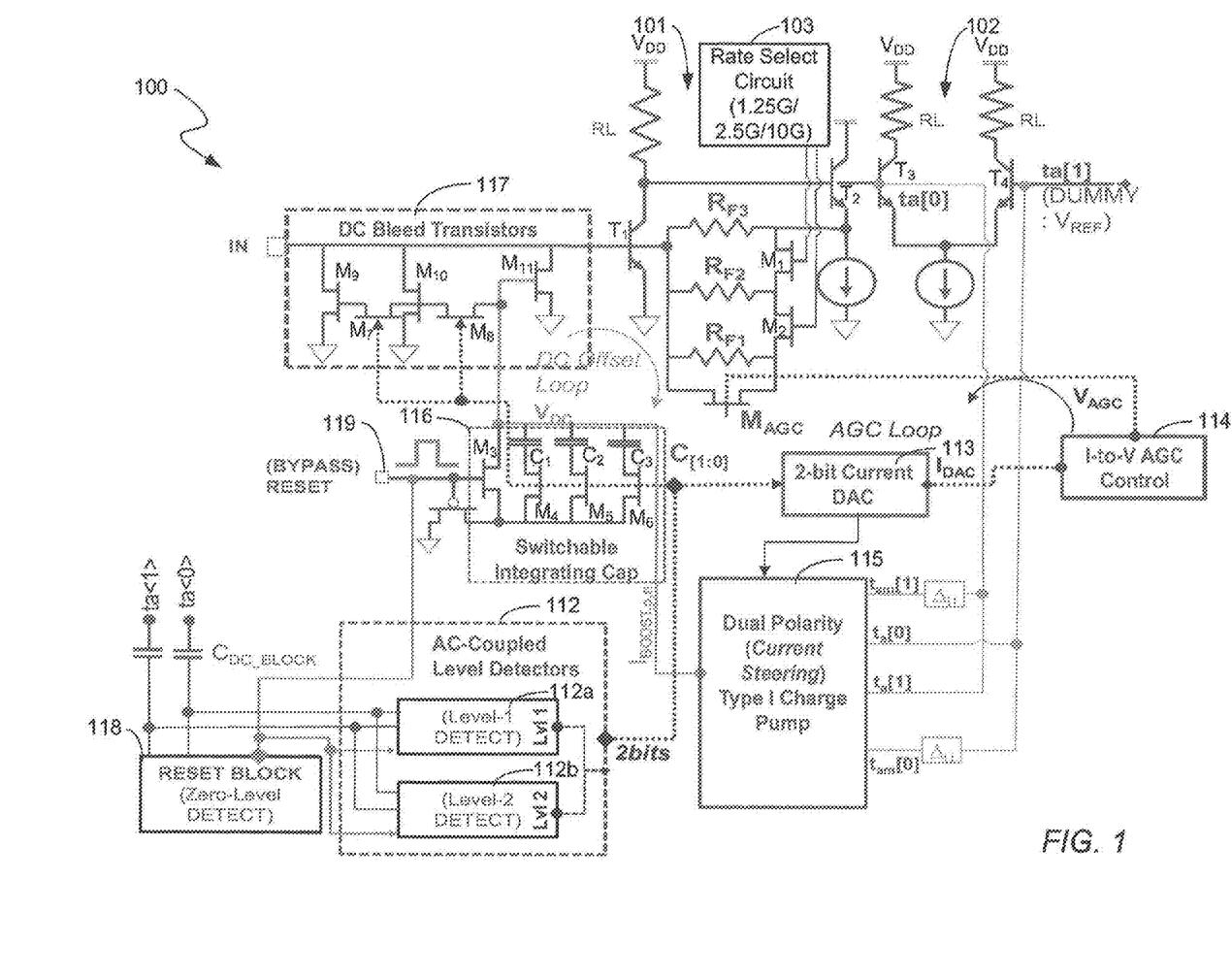
FIG. 1 illustrates a block diagram of a TIA circuit in accordance with an illustrative embodiment.

FIG. 1 illustrates a block diagram of a multi-data rate burst mode TIA circuit 100 in accordance with an illustrative embodiment. The TIA circuit 100 includes a first gain stage 101 that is a single-ended variable gain stage and a second gain stage 102 that is a single-ended-to-differential fixed gain stage. The first gain stage 101 includes first and second hetero-junction bipolar transistors (HBTs) $T_1$ and $T_2$, respectively, a resistive feedback network comprising a bank of switchable resistors, $R_{F1}$, $R_{F2}$ and $R_{F3}$ connected in parallel with one another and with a MOSFET $M_{AGC}$, a load resistor RL, and a rate select circuit 103. The switchable resistors $R_{F1}$, $R_{F2}$ and $R_{F3}$ are connected in series with two other MOSFETs $M_1$ and $M_2$ having gates that are connected to the rate select circuit 103. The combined circuitry of the switchable resistors $R_{F1}$, $R_{F2}$, and $R_{F3}$, the MOSFET $M_1$ and $M_2$ and the rate select circuit 103 comprises a data rate selection circuit. Because there are two PON standards (i.e. EPON and GPON) that are currently used in FTTH PON networks, the illustrative embodiment of the TIA circuit 100 is configured to support multiple data rates, namely, 1.25 Gbps/10 Gbps for the EPON standard and 2.5 Gbps/9.95 Gbps for the GPON standard. By using the rate select circuit 103 to activate or deactivate the MOSFETs $M_1$ and $M_2$, the feedback resistance provided by the parallel arrangement of resistors $R_{F1}$, $R_{F2}$ and $R_{F3}$ is varied to the appropriate resistance for the corresponding bandwidth. High data rates require a higher TIA bandwidth and hence a lower feedback resistance is selected across the first gain stage 101 for higher data rates. Conversely, lower data rates require a lower TIA bandwidth, and hence a higher feedback resistance is selected for lower data rates. Moreover, at lower data rates the data bursts have a lower input optical modulation amplitude (OMA), and therefore the first gain stage 101 should have a very high sensitivity. In those cases, the higher feedback resistance (i.e., higher transimpedance gain) helps to reduce input-referred noise at the input of the first gain stage, thereby improving sensitivity.

In accordance with the illustrative embodiment shown in FIG. 1, the first gain stage 101 has three feedback resistors, $R_{F1}$, $R_{F2}$, $R_{F3}$ and two MOSFET switches, $M_1$ and $M_2$. However, the first gain stage 101 could have a different number of resistors and switches. For example, increasing the number of resistors and switches would allow the TIA circuit 101 to operate at greater number of data rates. When the $M_1$ and $M_2$ switches are both OFF, the first gain stage 100 operates at the 1.25 Gbps (low) data rate with a gain of $R_{F1}$. When the $M_1$ switch is turned ON and the $M_2$ switch is turned OFF, the first gain stage 101 operates at the 2.5 Gbps (medium) data rate with a gain of $R_{F1} \times R_{F2}/(R_{F1}+R_{F2})$. When the M1 and M2 switches are both ON, the first gain stage 101 operates at the 10 Gbps (high) data rate with a gain of $R_{F1} \times R_{F2} \times R_{F3}/(R_{F1} \times R_{F2}+R_{F2} \times R_{F3} \pm R_{F1} \times R_{F3})$. Thus, in accordance with this representative embodiment, the TIA circuit 100 is capable of operating at three or more data rates. The second gain stage 102 is a single-ended-to-differential fixed gain differential pair of transistors $T_3$ and $T_4$. The second gain stage 102 has a small-signal gain of $-gm \times RL/2$ as only one half of the differential pair receives the input signal output from the first gain stage 101, where RL is the load resistance of the second gain stage 102. The other half of the differential pair is set to a fixed reference voltage, $V_{REF}$.

As indicated above, the multi-rate burst-mode TIA circuit 100 has a DC offset correction loop and an AGC loop. In accordance with this embodiment, both of the loops are connected to a common reset pin 119, which is used to restore the internal nodes of the loops to their default state, as will be described below in more detail. The AGC loop regulates the transimpedance gain of the first gain stage 101 by increasing or decreasing the feedback resistance provided by resistive feedback network of the first gain stage 101. When the amplitude of the input signal applied to the base of the HBT $T_1$ is large, the AGC loop decreases the feedback resistance and when the amplitude of the input signal applied to the base of the HBT $T_1$ is small, the AGC loop increases the feedback resistance. The AGC loop comprises a level detection circuit 112, an M-bit current-mode digital-to-analog converter (DAC) 113, where M is a positive integer that is greater than or equal to 2, a current-to-voltage converter 114, and the MOSFET $M_{AGC}$ of the first gain stage 101.

The level detection circuit 112 detects the level of the differential signal output from the second gain stage 102 and outputs a corresponding M-bit value to the DAC 113, which converts the M-bit value into an analog current signal. The analog current signal is converted into an analog voltage signal, which is applied to the gate of MOSFET $M_{AGC}$. The MOSFET $M_{AGC}$ functions as a variable resistor having a resistance that varies based on the magnitude of the gate voltage. By varying this resistance, the gain of the first gain stage 101 is varied.

In accordance with an illustrative embodiment, the level detection circuit 112 comprises M alternating current (AC)-coupled level detectors 112a and 112b. Instead of using a peak or envelope detector for this purpose, as is common in AGC loops in typical TIA circuits, and which have slower settling times, preferably M Schmitt trigger hysteresis comparators are used for this purpose due to their faster settling times. For illustrative purposes, it is assumed that M=2. The appropriate level detector 112a and 112b is triggered when the differential output signal is at a particular voltage level. The outputs of the level detectors 112a and 112b are converted via the DAC 113 and the current-to-voltage converter 114 into the gate voltage of MOSFET $M_{AGC}$, thereby causing the transimpedance gain of the first gain stage 101 to be varied accordingly. Thus, the feedback resistance of the first gain stage 101, which has previously been fixed by the rate select circuit 103 for a given data rate, is regulated by the AGC loop by modifying the gate voltage of MOSFET $M_{AGC}$.

Comparators are typically capable of detecting high speed signal amplitudes very fast, but they suffer from meta-stability. Meta-stability is a problem that occurs in latching comparators when the input is near the comparator decision point. The problem occurs when the comparator takes more time to switch to a valid output state than is available in the sample interval. In accordance with the illustrative embodiment, by using hysteresis comparators in the level detectors 112a and 112b, which introduce memory effect in the form of ΔV, reduced meta-stability is achieved.

Figure 2:
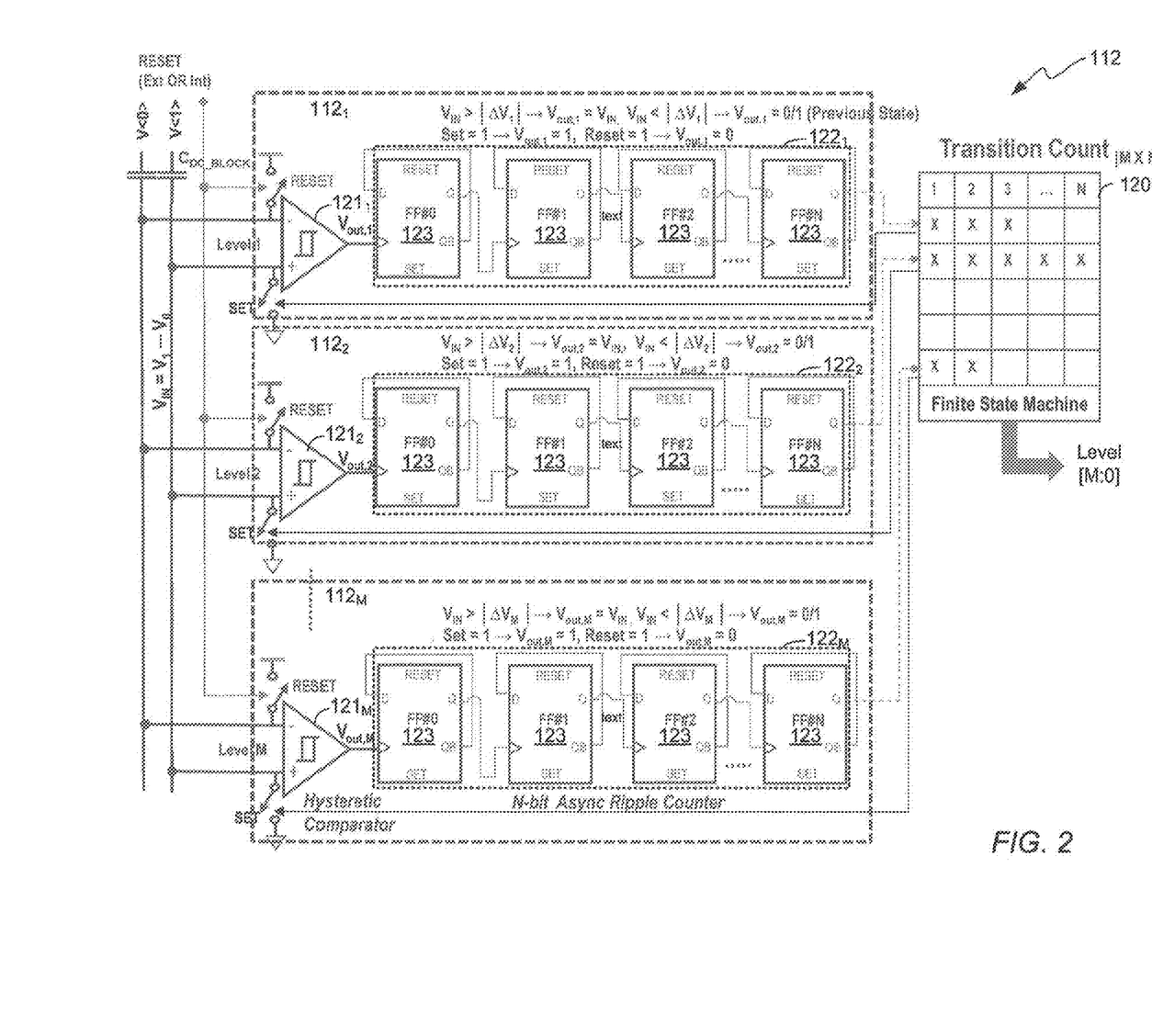
FIG. 2 illustrates a block diagram of the level detection circuit shown in FIG. 1 in accordance with an illustrative embodiment.

Before describing the DC offset correction loop, an illustrative embodiment of the level detection circuit 112 will be described with reference to FIG. 2. FIG. 2 illustrates a block diagram of the level detection circuit 112 having a finite state machine (FSM) 120 and M AC-coupled level detectors $112_1$-$112_M$, each of which comprises a hysteresis comparator $121_1$-$121_M$, respectively, and an asynchronous ripple counter $122_1$-$122_M$, respectively. Each of the M hysteresis comparators $121_1$-$121_M$ has a fixed hysteresis level, $|\Delta V_K|$ that is different from all of the other fixed hysteresis levels. Each ripple counter $122_1$-$122_M$ is an N-bit asynchronous ripple counter that changes state on every input transition, where N is a positive integer. Each ripple counter $122_1$-$122_M$ comprises N latches 123.

The outputs of the comparators $121_1$-$121_M$ are fed to the clock inputs of the respective asynchronous ripple counters $122_1$-$122_M$. The outputs of the ripple counters $122_1$-$122_M$ are fed to the FSM 120. When N transitions are detected by the FSM 120 for a given one of the level detectors $112_1$-$112_M$, the output of the ripple counter $122_1$-$122_M$ that is fed to the FSM 120 is a logic 1. This causes the FSM 120 to set the output of the corresponding comparator $121_1$-$121_M$ to a logic 1 and to confirm the input signal amplitude level by sending the M bits to the current-mode DAC 113 (FIG. 1). The current-mode DAC 113 outputs the corresponding analog current signal to the current-to-voltage converter 114 (FIG. 1), which generates the gate voltage for MOSFET $M_{AGC}$. Thus, based on the input OMA levels, the gain of the first gain stage 101 is adjusted accordingly.

In the example where M=2, when the outputs of the level detectors 112a and 112b are both logic 0, the gain of the first gain stage 101 is set to a high gain. When the outputs of the level detectors 112a and 112b are logic 1 and logic 0, respectively, the gain of the first gain stage 101 is set to a medium gain. When the outputs of the level detectors 112a and 112b are both logic 1, the gain of the first gain stage 101 is set to a low gain. Additionally, as will be described below in more detail, the M bits output by the FSM 120 are also used by the DC offset correction loop to regulate the DC offset correction.

With reference again to FIG. 1, in accordance with an illustrative embodiment, the DC offset correction feedback loop comprises a charge pump 115, a switchable integrating capacitor bank 116 and a DC current injecting/bleeding circuit 117. The switchable integrating capacitor bank 116 comprises a plurality of MOSFET switches $M_3$, $M_4$, $M_5$ and $M_6$ and a plurality of capacitors $C_1$, $C_2$ and $C_3$. The DC current injecting/bleeding circuit 117 comprises a plurality of MOSFET switches $M_7$ and $M_8$ and a plurality of DC bleed transistors $M_9$, $M_{10}$ and $M_{11}$.

The M bits that are output from the FSM 120 are received by the switchable integrating capacitor bank 116 and by the DC current injecting/bleeding circuit 117. Those bits are used to selectively activate/deactivate the MOSFET switches $M_3$-$M_8$. Selectively activating/deactivating the MOSFET switches $M_3$-$M_6$ causes an appropriate feedback capacitance to be set in the switchable integrating capacitor bank 116 based on the average input OMA level detected by the level detection circuit 112. Selectively activating/deactivating the MOSFET switches $M_7$ and $M_8$ causes DC current to be injected into or shunted away from the base of HBT $T_1$ through one or more of the bleed transistors $M_9$, $M_{10}$ and $M_{11}$, depending on whether the corresponding MOSFET switches $M_7$ and/or $M_8$ are activated/deactivated. Activation/deactivation of the MOSFET switches $M_7$ and $M_8$ also causes the feedback resistance of the DC offset correction loop to be varied. The switchable integrating capacitor bank 116 sets the DC voltage at the gates of the bleeding transistors $M_9$-$M_{11}$. The bleeding transistors $M_9$-$M_{11}$ shunt the input DC current to ground when there is a common mode DC offset voltage at the output of the second gain stage 102.

To meet the short burst synchronization timing requirement for EPON and GPON networks, the DC loop settling time should be less than 100 ns. This can be achieved by reducing the resistance and capacitance of the DC offset correction loop, but doing so would result in a lower cut-off frequency at the output of the second gain stage 102. To avoid that, the charge pump 115 is used. The Charge pump is a dual polarity (i.e., current steering) charge pump that either charges or discharges the integrating capacitors $C_1$-$C_3$ to source or sink current. The charge pump 115 includes a dual-polarity boost circuit (not shown) for this purpose. The charge pump 115 receives the analog current signal output from the current-mode DAC 113 and the differential voltage signal output by the second gain stage 102. The signal output from the DAC 113 is asserted whenever the DC offset voltage is greater than or equal to a user-specified amount and is de-asserted when the DC offset voltage is less than the user-specified amount. The boost circuit helps to reduce the DC offset correction loop settling time and also saves power because it is only engaged whenever the DC offset is greater than the user-specified amount and is otherwise disengaged, which is most of the time.

The reset block 118 outputs a reset pulse to the internal nodes of the AGC feedback loop and the DC offset correction feedback loop to cause their internal nodes to be reset to initial conditions. The reset pulse can also be externally generated, as indicated by reset bypass pin 119. As indicated above, FTTH PONs communicate data in the form of asynchronous data packets. These packets resemble bursts of data with guard bands in between data packets where there is no data. Because the data packets come at different data rates and varying OMA levels, they are not DC balanced. For this reason, a reset pulse is provided either externally or on-chip to reset the internal node voltages of the feedback loops to initial conditions. This helps reduce the loop settling times and enables short burst synchronization times to be achieved.

Figure 3:
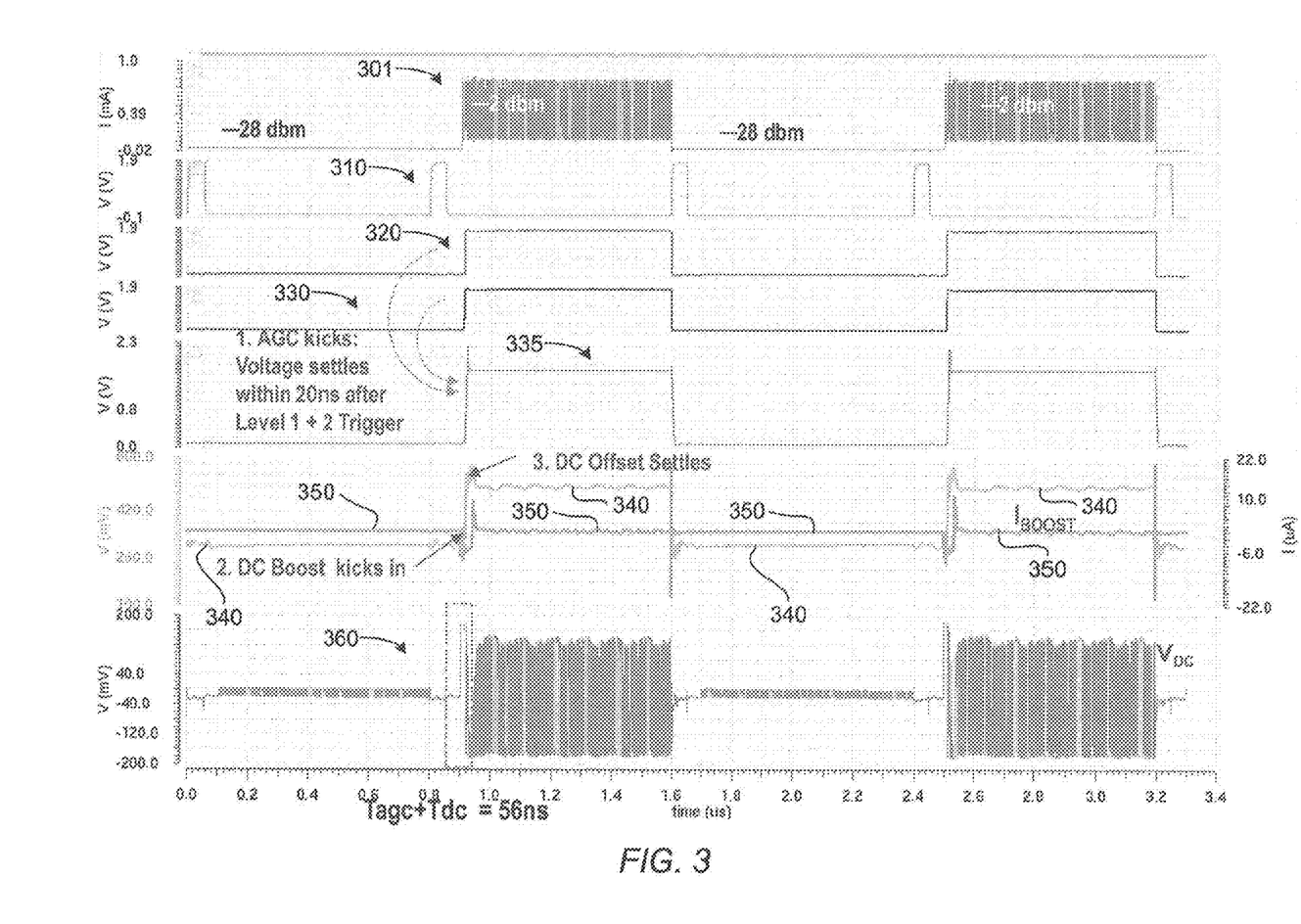
FIG. 3 is a timing diagram demonstrating the manner in which the TIA circuit shown in FIG. 1 operates when operating at a data rate of 1.25 Gbps.

FIG. 3 is a timing diagram demonstrating the manner in which the TIA circuit 100 operates when operating at a data rate of 1.25 Gbps. The top waveform 301 corresponds to an input burst of burst mode data packets received at the input of the first gain stage 101. The units are in milliamperes (mA) on the vertical axis and time in microseconds on the horizontal axis. The waveform 310 corresponds to the reset pulse. The units for waveform 310 are in volts (V) on the vertical axis and time in microseconds on the horizontal axis. The waveform 320 corresponds to the output of the first level detector 112a. The waveform 330 corresponds to the output of the second level detector 112b. The units for waveforms 320 and 330 are in volts (V) on the vertical axis and time in microseconds on the horizontal axis. The waveform 335 corresponds to the gain of the first gain stage regulated by AGC feedback loop. The waveform 340 corresponds to the DC offset correction applied at the gate of HBT $T_1$ by the DC offset correction loop. The units for waveform 340 are in millivolts (mV) on the vertical axis and time in microseconds on the horizontal axis. The waveform 350 superimposed on waveform 340 corresponds to the boost current applied by the boost circuit of the charge pump 115. The units for waveform 350 are in microamperes (μA)

on the vertical axis and time in microseconds on the horizontal axis. The waveform 360 corresponds to the differential signal output from the second gain stage 102. The units for waveform 360 are in mV on the vertical axis and time in microseconds on the horizontal axis.

With respect to the waveform 301, the input signal to the TIA circuit 100 is at −28 dbm between data bursts and at −2 dbm during data bursts. The rest pulse is only asserted immediately before and after each data burst and is otherwise deasserted. In this example, the outputs of each of the level detectors 112a and 112b result in the gain shown in waveform 335. The settling time of the AGC feedback loop corresponding to the amount of time that passes from when the overshoot in the gain occurs to when the gain settles to its steady state is only about 20 ns. With respect to waveforms 340 and 350, it can be seen the DC boost causes the DC offset correction loop to settle within about 36 ns. The differential output waveform 360 tracks the input burst waveform 301, but takes about 56 ns to settle. The amount of time that it takes the differential output waveform 360 to settle is the sum of the DC offset correction loop settle time and the AGC loop settle time. This amount of time corresponds to the synchronization time of the TIA circuit 100, which is well within the 100 ns synchronization time required by the specifications for PON networks.

Figure 4:
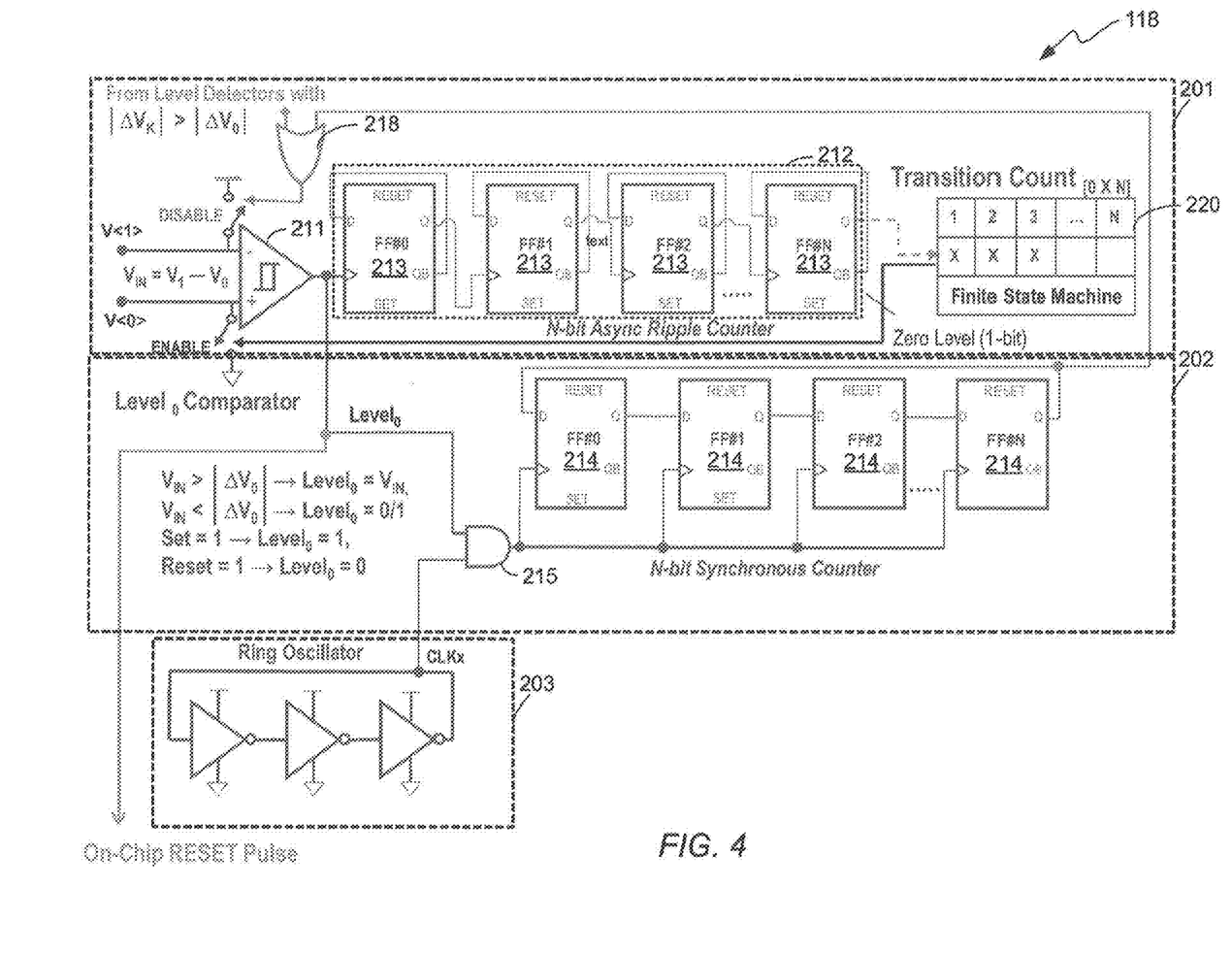
FIG. 4 illustrates a block diagram of the reset block shown in FIG. 1 in accordance with an illustrative embodiment.

FIG. 4 illustrates a block diagram of the reset block 118 shown in FIG. 1 in accordance with an illustrative embodiment. Because the settling times of the DC offset correction and the AGC feedback loops are required to be very small in order to meet the stringent synchronization specifications defined for PON networks, having precise initial voltage or current conditions in the internal nodes of these loops at the start of a burst can shorten the loop settling time. For this reason, the TIA circuit 100 preferably includes the reset block for generating a reset pulse that restarts the loops from known initial conditions. Also, typical receiver optical sub-assemblies (ROSAs) are small and have only a few input/output pins. In such cases, there is typically no area left in the ROSA for a reset pin. As a result, an on-chip reset pulse generation circuit is needed inside of the TIA circuit chip. The reset block 118 provides such a solution. Additionally, the reset block 118 is also capable of detecting long sequences of zero bits, which allows the TIA circuit 100 to determine that it is receiving erroneous data.

In accordance with this illustrative embodiment, the reset block 118 comprises a zero-level detector 201, an N-bit synchronous counter 202 and a ring oscillator 203. The zero-level detector 201 is nearly identical to the level detectors $112_1$-$112_M$ shown in FIG. 2. The zero-level detector 201 has a hysteresis comparator 211, an asynchronous ripple counter 212 and a FSM 220. The asynchronous ripple counter 212 is an N-bit asynchronous ripple counter that changes state on every input transition, where N is a positive integer. The N-bit asynchronous ripple counter 212 comprises N latches 213. The N-bit synchronous counter 202 comprises N latches 214 and an AND gate 215. The output of the comparator 211 is fed to the clock input of the N-bit asynchronous ripple counter 212. The output of the ripple counter 212 is fed to the FSM 220. When N transitions are detected by the FSM 220, the output of the ripple counter 212 that is fed to the FSM 220 is a logic 1, which indicates that a string of N logic 0s has been detected. This causes the FSM 220 to set the output of the comparator 211 to a logic 1 so that the output of the asynchronous ripple counter 212 remains at a logic 1. The logic 1 output by the comparator 211 corresponds to the asserted reset pulse received at the node connected to pin 119 (FIG. 1).

The output of the ring oscillator 203 and the output of the comparator 211 are inputs to the AND gate 215. When both of these inputs are logic 1s, the output of the AND gate 215, which is used as the clock signal for the latches 214 of the N-bit synchronous counter 202, also goes high. Therefore, when the output of the comparator is a logic 1, then once the clock signal output by the ring oscillator 203 has transitioned a predetermined number of times, the output of the N-bit synchronous counter 202 becomes a logic 1, which causes an OR gate 218 to set the output of the comparator 211 to logic 0.

In accordance with this illustrative embodiment, the ring oscillator 203 is a 3-to-6 CMOS inverter-based ring oscillator that generates a clock at a very low frequency ($F_{CLK}$) compared to the received data rate. After the FSM 220 causes the output of the comparator 211 to be asserted, thereby causing the reset pulse to be asserted, the clock signal generated by the ring oscillator 203 is sent to the N-bit synchronous counter 202. The synchronous counter counts N clock pulses and then sends a signal to the OR gate 218 to cause the output of the comparator 211 to be de-asserted, which de-asserts the reset pulse. Thus, the reset pulse is of duration N/$F_{CLK}$, during which the feedback loops are reset to the initial states.

The zero-level detector 201 is disabled during data bursts, but it can erroneously trigger a reset pulse if a data burst has a long series of 0 bits. Typically, the data in a PON network is encoded such that long strings of 0 or 1 bits are not allowed in the data packets. Therefore, if the data packet has a long string of 0 bits that causes the reset pulse to be asserted, then this implies that the received data has bit errors. The only time period during which the TIA circuit 100 receives a long string of 0 bits is during the Guard or Dead time. Hence, the transition count contained in the FSM 220 confirms if the detected zero level is occurring during the Guard or Dead time.

Figure 5:
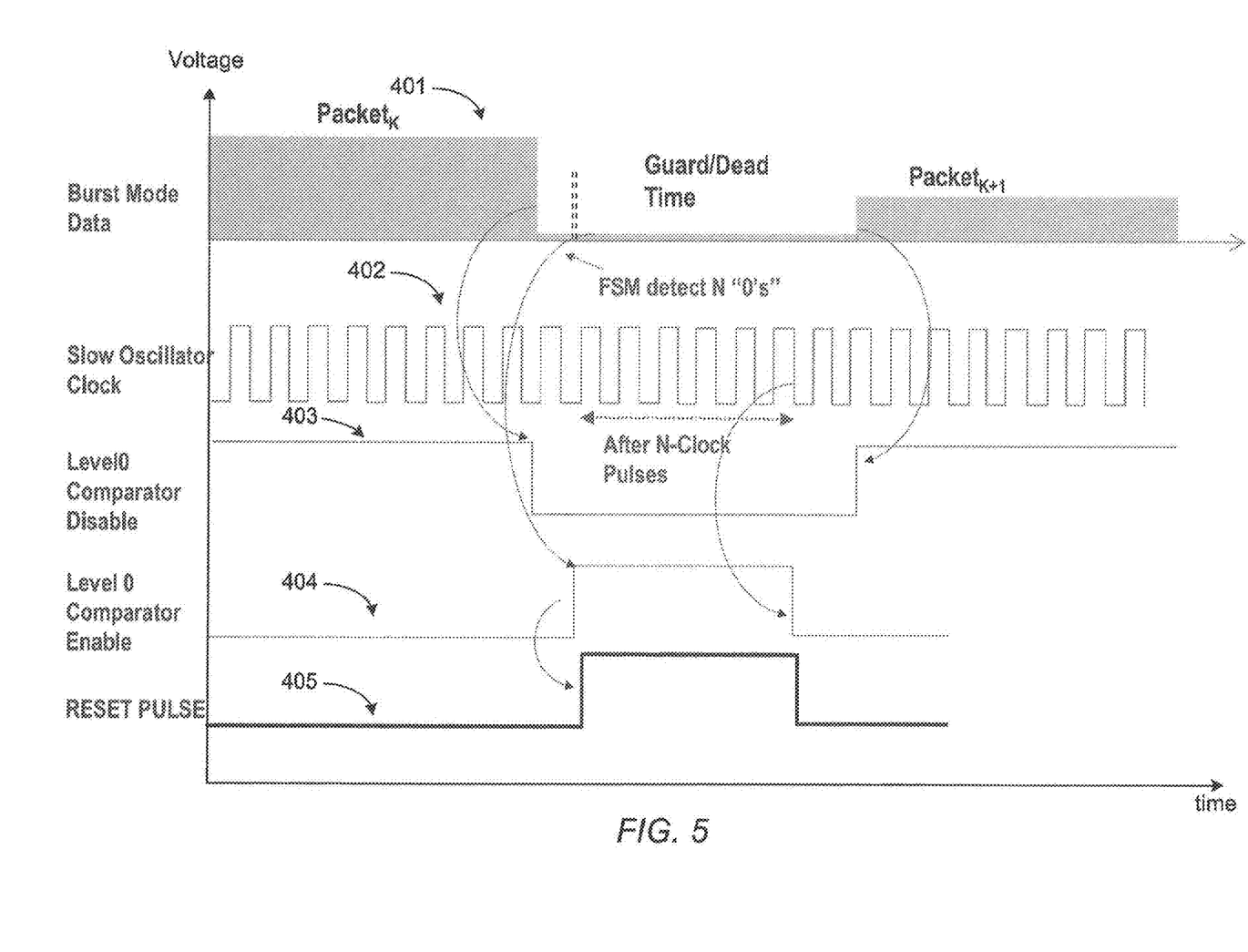
FIG. 5 is a timing diagram demonstrating the manner in which the reset block shown in FIG. 4 operates.

FIG. 5 is a timing diagram demonstrating the manner in which the reset block 118 operates. Waveform 401 corresponds to an input burst of burst mode data packets output as the differential output signal of the second gain stage 102 and input to the reset block 118. Waveform 402 corresponds to the clock signal generated by the ring oscillator 203. Waveform 403 corresponds to the disable signal output from the OR gate 218 to the comparator 211. Waveform 404 corresponds to the enable signal output from the FSM 220 to the comparator 211. Waveform 405 corresponds to the reset pulse generated by the reset block 118. The vertical axis represents voltage and the horizontal axis represents time.

It can be seen from waveform 403 that at any time other than during the Guard or Dead time between packet bursts, the disable signal output from the OR gate 210 to the comparator 211 is asserted, thereby preventing the rest pulse from being asserted during that time period. Therefore, the reset pulse represented by waveform 405 is always deasserted while the disable signal is asserted. During the Guard or Dead time, the disable signal is deasserted, and therefore the reset signal can be asserted during the Guard or Dead time. After the FSM 220 has counted N 0 bits while the disable signal is deasserted, the enable signal represented by waveform 404 is asserted, which results in the reset pulse represented by waveform 405 being asserted. Once N clock pulses (waveform 402) of the ring oscillator 203 have occurred after the reset pulse and enable signal have been asserted, the enable signal and the reset pulse are deasserted. At the end of the Guard or Dead time, the disable signal (waveform 403) is again asserted.

It should be noted that although the illustrative embodiments have been described with reference to a few illustrative embodiments for the purpose of demonstrating the principles and concepts of the invention. Persons of skill in the art will understand how the principles and concepts of the invention can be applied to other embodiments not explicitly described herein. It should also be noted that the circuits and method described above with reference to FIGS. 1-5 are merely examples of suitable circuit configurations and methods that demonstrate the principles and concepts of the invention. As will be understood by those skilled in the art in view of the description being provided herein, many modifications may be made to the embodiments described herein while still achieving the goals of the invention, and all such modifications are within the scope of the invention.

What is claimed is:

1. A transimpedance amplifier (TIA) circuit for use in a receiver used to receive asynchronous data sent in bursts over optical networks, the TIA circuit being capable of operating at multiple data rates, the TIA circuit receiving an TIA input signal at an input terminal of the TIA circuit and outputting a TIA output signal from an output terminal of the TIA circuit;
    a data rate selection circuit that is configured to be switched between multiple settings to select the data rate at which the TIA circuit operates;
    a direct current (DC) offset correction loop configured to apply a DC offset correction at the input terminal of the TIA circuit, wherein the DC offset correction loop comprises:
        a capacitor bank comprising a plurality of capacitors and at least a first switch that can be activated and deactivated;
        a direct current (DC) injecting/bleeding circuit electrically coupled to the input terminal of the TIA circuit and to the capacitor bank and comprising at least a second switch that can be activated and deactivated and at least a first bleed transistor; and
        a level detection circuit that selectively activates and deactivates the first and second switches based on a TIA output signal outputted from the output terminal to control said at least a first bleed transistor to inject current into or shunt current away from the input terminal.

2. The TIA circuit of claim 1, wherein the data rate selection circuit includes a bank of switchable resistors.

3. The TIA circuit of claim 2, wherein the bank of switchable resistors comprises:
    at least first and second resistors connected in parallel; and
    at least a first transistor connected in series in between the first and second resistors.

4. The TIA circuit of claim 3, wherein the bank of switchable resistors comprises:
    at least a third resistor connected in parallel with the first and second resistors;
    at least a second transistor connected in series in between the second and third resistors; and
    a third resistor connected in parallel with the first, second and third resistors.

5. The TIA circuit of claim 1, wherein the DC offset correction loop further comprises:
    a charge pump electrically coupled to the capacitor bank, the DC injecting/bleeding circuit and to the level detection circuit, the charge pump charging and discharging the capacitors of the capacitor bank.

6. The TIA circuit of claim 5, wherein the capacitor bank further comprises at least a third switch that can be activated and deactivated by the level detection circuit.

7. The TIA circuit of claim 6, wherein the DC injecting/bleeding circuit includes at least a fourth switch that can be activated and deactivated by the level detection circuit, and wherein the second and fourth switches are shunt transistors.

8. The TIA circuit of claim 7, wherein the charge pump is a dual-polarity charge pump.

9. The TIA circuit of claim 1, further comprising:
    an automatic gain control (AGC) loop configured to automatically control a gain of the TIA circuit.

10. The TIA circuit of claim 9, wherein the AGC loop includes the level detection circuit, the level detection circuit detecting a peak-to-peak amplitude of the TIA output signal at the output terminal of the TIA circuit and causing the gain of the TIA circuit to be varied based on the peak-to-peak amplitude.

11. The TIA circuit of claim 10, wherein the level detection circuit comprises:
    M comparators that are triggered when the TIA output signal crosses M threshold levels, respectively, where M is a positive integer that is greater than or equal to 2, the M comparators outputting M signals representing M bits, respectively, such that an M-bit current signal is output by the level detection circuit;
    an M-bit current-mode digital-to-analog converter (DAC) that converts the M bits into an analog current signal and output the analog current signal; and
    a current-to-voltage converter that converts the analog current signal outputted from the M-bit DAC into an analog voltage signal and outputs the analog voltage signal, and wherein the level detection circuit causes the gain of the TIA circuit to be adjusted based on the analog voltage signal outputted from the current-to-voltage converter.

12. The TIA circuit of claim 9, further comprising:
    a reset circuit that resets the TIA circuit if a loss of signal (LOS) indication is detected at the input terminal of the TIA circuit.

13. The TIA circuit of claim 12, wherein the reset circuit comprises:
    a zero-level detector that detects when the TIA input signal received at the input terminal of the TIA circuit is at a zero power level and outputs a pulse; and
    a counter that counts a number of pulses output by the zero-level detector, wherein the reset circuit outputs a reset signal that resets the TIA circuit when the count exceeds a predetermined number.

14. The TIA circuit of claim 13, wherein the counter comprises a free-running ring oscillator and an N-bit synchronous counter, where N is a positive integer greater than or equal to 1.

15. The TIA circuit of claim 13, wherein the counter comprises an N-bit ripple counter, where N is a positive integer greater than or equal to 1.

16. A transimpedance amplifier (TIA) circuit for use in a receiver used to receive asynchronous data sent in bursts over optical networks, the TIA circuit having an input terminal that receives a TIA input signal and an output terminal that outputs a TIA output signal, the TIA circuit comprising:
    an automatic gain control (AGC) loop configured to automatically control a gain of the TIA circuit, wherein the AGC loop includes a level detection circuit having an input that is electrically coupled to the output terminal of the TIA circuit, the level detection circuit detecting a peak-to-peak amplitude of the TIA output signal;

M comparators that are triggered when an output signal of the TIA circuit crosses M threshold levels, respectively, where M is a positive integer that is greater than or equal to 2, the M comparators outputting M signals representing M bit, respectively, such that an M-bit current signal is output by the level detection circuit;

an M-bit current-mode digital-to-analog converter (DAC) that converts the M bits into an analog current signal and output the analog current signal; and a current-to-voltage converter that converts the analog current signal outputted from the M-bit DAC into an analog voltage signal and outputs the analog voltage signal, and wherein the level detection circuit causes the gain of the TIA circuit to be adjusted based on the analog voltage signal outputted from the current-to-voltage converter.

17. The TIA circuit of claim 16, further comprising a data rate selection circuit, wherein the data rate selection circuit includes a switchable feedback resistor bank.

18. The TIA circuit of claim 17, further comprising a DC offset correction loop comprising:
- a capacitor bank comprising a plurality of capacitors; and
- a charge pump electrically coupled to the capacitor bank for charging and discharging capacitors of the capacitor bank.

19. The TIA circuit of claim 16, further comprising a reset circuit comprising:
- a zero-level detector that detects when the TIA input signal received at the input terminal of the TIA circuit is at a zero power level and outputs a pulse; and
- a counter that counts a number of pulses output by the zero-level detector, wherein the reset circuit outputs a reset signal that resets the TIA circuit when the count exceeds a predetermined number.

* * * * *